United States Patent [19]
Lim

[11] Patent Number: 5,915,176
[45] Date of Patent: Jun. 22, 1999

[54] METHOD OF MAKING FLOATING GATE BASED MEMORY DEVICE

[75] Inventor: Min-Gyu Lim, Chungcheongbuk-do, Rep. of Korea

[73] Assignee: LG Semicon Co., Ltd., Cheongju-si, Rep. of Korea

[21] Appl. No.: 08/929,111

[22] Filed: Sep. 15, 1997

[30] Foreign Application Priority Data

Dec. 26, 1996 [KR] Rep. of Korea ................... 96 72199

[51] Int. Cl.⁶ ............................................ H01L 21/8247
[52] U.S. Cl. ........................ 438/257; 438/286; 438/304; 257/322
[58] Field of Search ................................. 438/257–267, 438/304, 286; 257/322

[56] References Cited

U.S. PATENT DOCUMENTS

| | | |
|---|---|---|
| 4,775,642 | 10/1988 | Chang et al. . |
| 5,073,513 | 12/1991 | Lee .......................................... 438/304 |
| 5,108,939 | 4/1992 | Manley et al. . |
| 5,256,584 | 10/1993 | Hartmann . |
| 5,284,784 | 2/1994 | Manley . |
| 5,494,838 | 2/1996 | Chang et al. . |
| 5,585,293 | 12/1996 | Sharma et al. . |
| 5,587,332 | 12/1996 | Chang et al. . |
| 5,618,742 | 4/1997 | Shone et al. ............................ 438/263 |
| 5,631,482 | 5/1997 | Hong ....................................... 257/326 |

OTHER PUBLICATIONS

"A Flash–Erase Eeprom Cell With An Asymmetric Source and Drain Structure", H. Kume et al., Central Research Laboratory, IEDM 87, pp. 560–563, 1987.

*Primary Examiner*—Richard A. Booth
*Attorney, Agent, or Firm*—Fleshner & Kim

[57] ABSTRACT

Semiconductor memory device and method is provided for a stacked gate type flash semiconductor memory device. The semiconductor memory device improves programming and erasing operation efficiency. A gate oxide layer and a floating gate are formed to be stacked on a substrate. A first dielectric layer and a control gate are formed to be stacked on the floating gate. A second dielectric layer is formed on both sides of the floating gate and first and second semiconductor sidewalls are formed on the second dielectric layer on the both sides of the floating gate. Impurity regions are formed in the substrate at the both sides of the floating gate and a wire layer is formed to contact with the semiconductor sidewalls and each of the impurity regions.

9 Claims, 8 Drawing Sheets background background background background

FIG.2d background
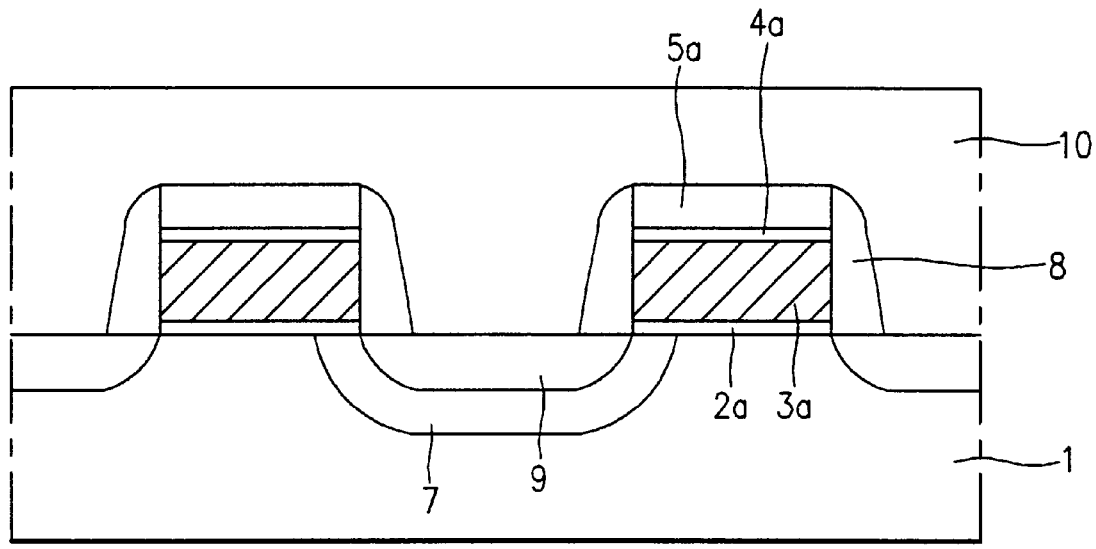
FIG.2e background
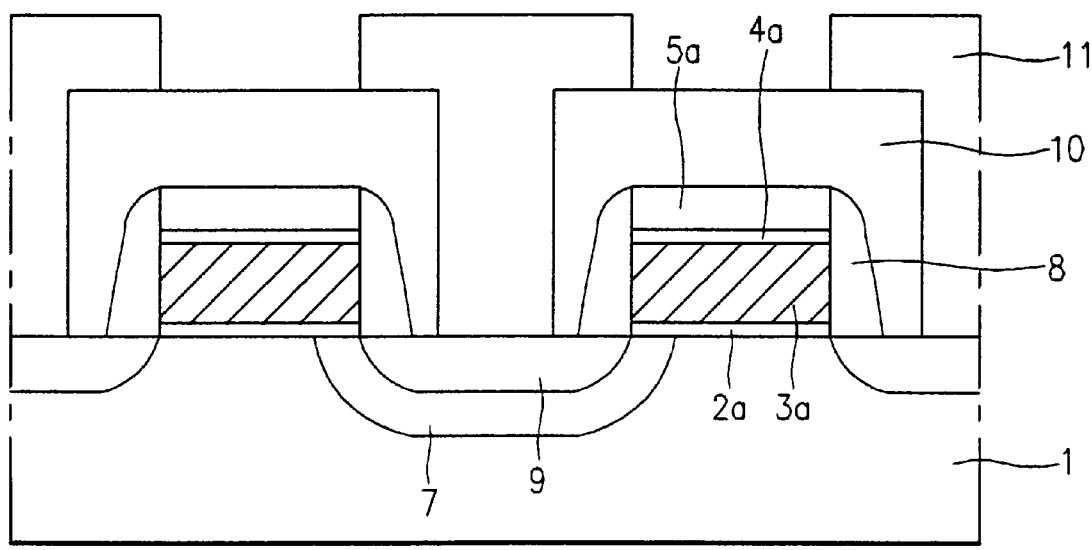

METHOD OF MAKING FLOATING GATE BASED MEMORY DEVICE

BACKGROUND OF THE INVENTION

1. Field of the Invention

The present invention relates to a semiconductor memory device, and more particularly, to a stacked gate type flash semiconductor memory device, and a method for manufacturing the same.

2. Background of the Related Art

FIG. 1 is a diagram showing a cross-sectional view of a structure of a related art semiconductor memory device. FIGS. 2a through 2e are diagrams showing cross-sectional views illustrating a related art method for manufacturing the semiconductor memory device.

Referring to FIG. 1, the related art semiconductor memory device is a stacked gate type flash memory device. On a substrate 1, a tunnel oxide layer 2a and a floating gate 3a are formed to be stacked. On the entire surface of the floating gate 3a, an interpoly dielectric layer 4a and a control gate 5a are formed to be stacked. Insulating sidewalls 8 are formed on both sides of the control gate 5a and the floating gate 3a. While a lightly-doped source region 7 is formed at either of both sides of the floating gate 3a, heavily-doped source and drain regions 9 are formed in the substrate 1 at both the sides of the floating gate 3a. On the entire surface, there is formed an interlayer insulating layer 10 having contact holes. Each of the contact holes is formed on each of the heavily-doped source and drain regions 9. A wiring layer 11 is formed to contact with each of the heavily-doped source and drain regions 9 via the contact holes.

A related art method for manufacturing the semiconductor memory device of FIG. 1 will be explained with reference to the accompanying drawings. First, a first thin oxide layer 2 is formed on a substrate 1, as shown in FIG. 2a. Then, a first polysilicon layer 3 is formed on the first oxide layer 2. Next, the first oxide layer 2 and the first polysilicon layer 3 are patterned to form a thin tunnel oxide layer 2a and a floating gate 3a.

Subsequently, a second oxide layer 4 and a second polysilicon layer 5 are successively formed on the entire surface, as shown in FIG. 2b. Next, as shown in FIG. 2c, the second oxide layer 4 and the second polysilicon layer 5 are etched at a right angle to the floating gate 3a to form an interpoly dielectric layer 4a and a control gate 5a. Simultaneously, the tunnel oxide layer 2a and the floating gate 3a are etched. Subsequently, a photoresist layer 6 is coated on the entire surface and then is subjected to exposure and development to be patterned until the surface of the substrate for the placement of a source region is exposed. Thereafter, lightly-doped source impurity ions are implanted into the exposed substrate 1, which is then annealed for diffusion to form a lightly-doped source region 7.

Referring to FIG. 2d, the remaining photoresist layer 6 is removed. Next, a third oxide layer is formed and then subjected to etch-back to form insulating sidewalls 8 at both the sides of the control gate 5a and of the floating gate 3a. As shown in FIG. 2d, with the control gate 5a and the floating gate 3a serving as masks, heavily-doped impurity ions are implanted into the exposed substrate 1 to form the source and drain regions 9. Then, an interlayer insulating layer 10 is formed on the entire surface.

Referring to FIG. 2e, the interlayer insulating layer 10 is anisotropically etched to expose the source and drain regions 9 to form contact holes. Next, a wiring layer 11 of a conductive metal is formed in each of the contact holes.

Programming data in the related art semiconductor memory device is achieved by a process of injecting into a floating gate high thermal electrons made in a channel. As the programming proceeds, a threshold voltage is increased because of electrons accumulated in the floating gate.

Programming efficiency greatly depends on a voltage induced to the floating gate. Also, programming efficiency is improved as a coupling ratio, which is an induced voltage ratio of the floating gate relative to an applied voltage of the control gate, is increased.

Erasing data in a semiconductor memory device is achieved by a process of removing electrons from the floating gate 3a to the source region. Since electrons are taken out of the floating gate 3a, a threshold voltage of a cell is decreased. The operation to erasing data is performed by moving electrons from the floating gate 3a to the source region by F-N tunneling. In a related art method, a thin tunnel oxide layer 2a is used to increase erasing efficiency.

However, a related art semiconductor memory device has various disadvantages and problems. A thickness of a tunnel oxide layer becomes thin to improve efficiency of erasing data. When the tunneling oxide layer becomes thin, electrostatic capacities of a floating gate and a channel are increased, so that a coupling ratio of a cell is reduced. As a result, programming data efficiency is reduced Since erasing operations are repeated more than 0.1 million times, the efficiency of erasing data is reduced because of thinness of the tunnel oxide layer. Accordingly, the process of forming a tunnel oxide layer is difficult and good reliability of a device is difficult to achieve. Moreover, data programmed in a memory cell can be erased by a low drain voltage.

The source region should be deeply diffused so the source junction is not destroyed because of a voltage applied to the source region for erasing data. Thus, a size of the device is enlarged, which reduces the degree of integration. Since a process tolerance should be provided to prevent shorts between the contact wire and the floating gate, the design of a semiconductor memory device and its manufacturing process also become difficult.

SUMMARY OF THE INVENTION

An object of the present invention is to provide a semiconductor memory device and a manufacturing method thereof that substantially obviate one or more of problems caused by limitations and disadvantages of the related art.

Another object of the present invention is to provide a semiconductor memory device and a manufacturing method thereof that provides a low voltage control gate for at least one of programming and erasing operations.

Another object of the present invention is to provide a semiconductor memory device and a manufacturing method thereof that achieves a increased integration of a memory cell.

Another object of the present invention is to provide a semiconductor memory device and a manufacturing method thereof that improves device reliability.

Another object of the present invention is to provide a semiconductor memory device and a manufacturing method thereof that increases a device reading speed.

To achieve these and other advantages in whole or in part and in accordance with the purpose of the present invention, as embodied and broadly described, the semiconductor memory device includes a substrate; a floating gate and a gate oxide layer stacked on the substrate; a first dielectric layer and a control gate stacked on the floating gate; a second dielectric layer on both sides of the floating gate; first and second semiconductor sidewalls on the second dielectric layer on the both sides of the floating gate; impurity regions in the substrate at the both sides of the floating gate; a wire layer contacting the semiconductor sidewalls and each of the impurity regions.

In another aspect of the present invention, there is provided a method for manufacturing a semiconductor memory device including forming a first insulating layer and a semiconductor layer on a substrate and patterning the first insulating layer and the semiconductor layer; forming a second insulating layer and a semiconductor layer substantially perpendicular to the first insulating layer and the first semiconductor layer; forming insulating sidewalls on both sides of the second semiconductor layer; etching the first semiconductor layer and the first insulating layer with the insulating sidewalls and the second semiconductor layer serving as masks to respectively form a gate oxide layer and a floating gate; forming a second dielectric layer on both sides of the floating gate; forming first and second semiconductor sidewalls on the second dielectric layer on the both sides of the floating gate; forming impurity regions in the substrate at both the sides of the floating gate; forming a wire layer in contact with the each of the impurity regions and the semiconductor sidewalls.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

FIGS. 2a–2e are schematic cross-sectional diagrams showing a related art method for manufacturing a semiconductor memory device;

DETAILED DESCRIPTION OF PREFERRED EMBODIMENTS

Figure 1:
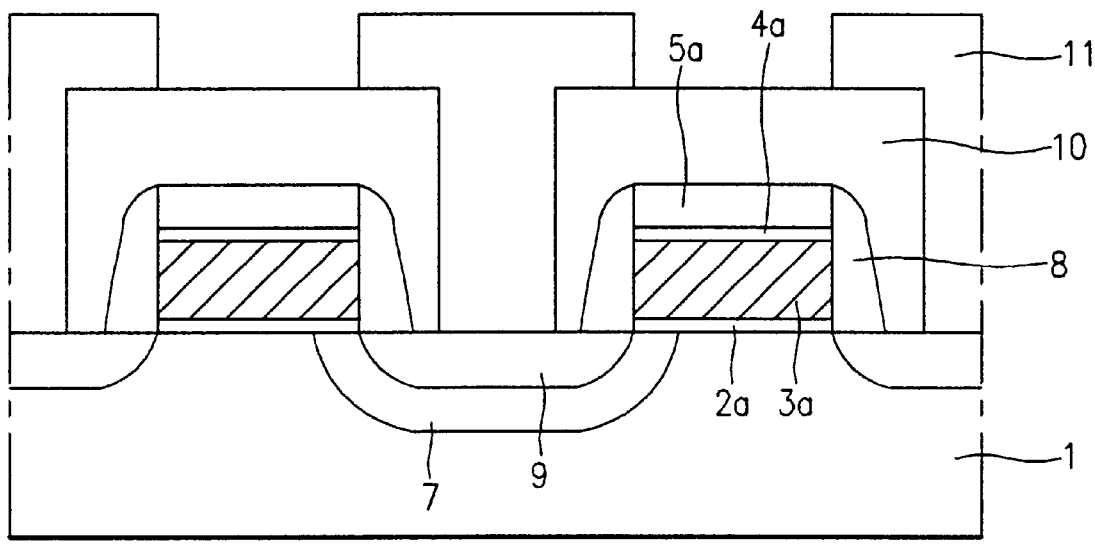
FIG. 1 is a cross-sectional diagram showing a related art semiconductor memory device.
Figure 2A:
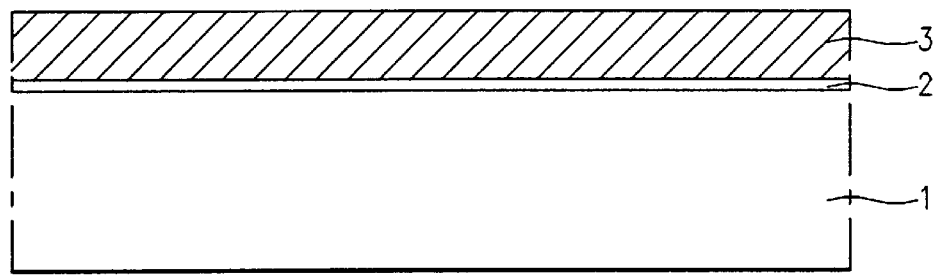
Figure 2B:
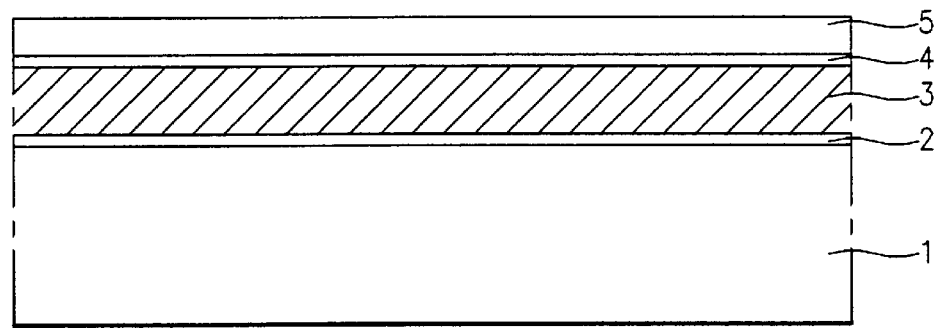
Figure 2C:
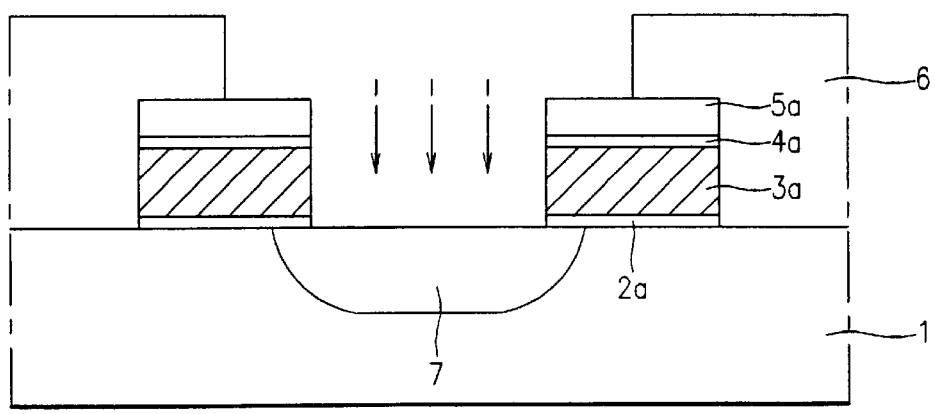
Figure 3:
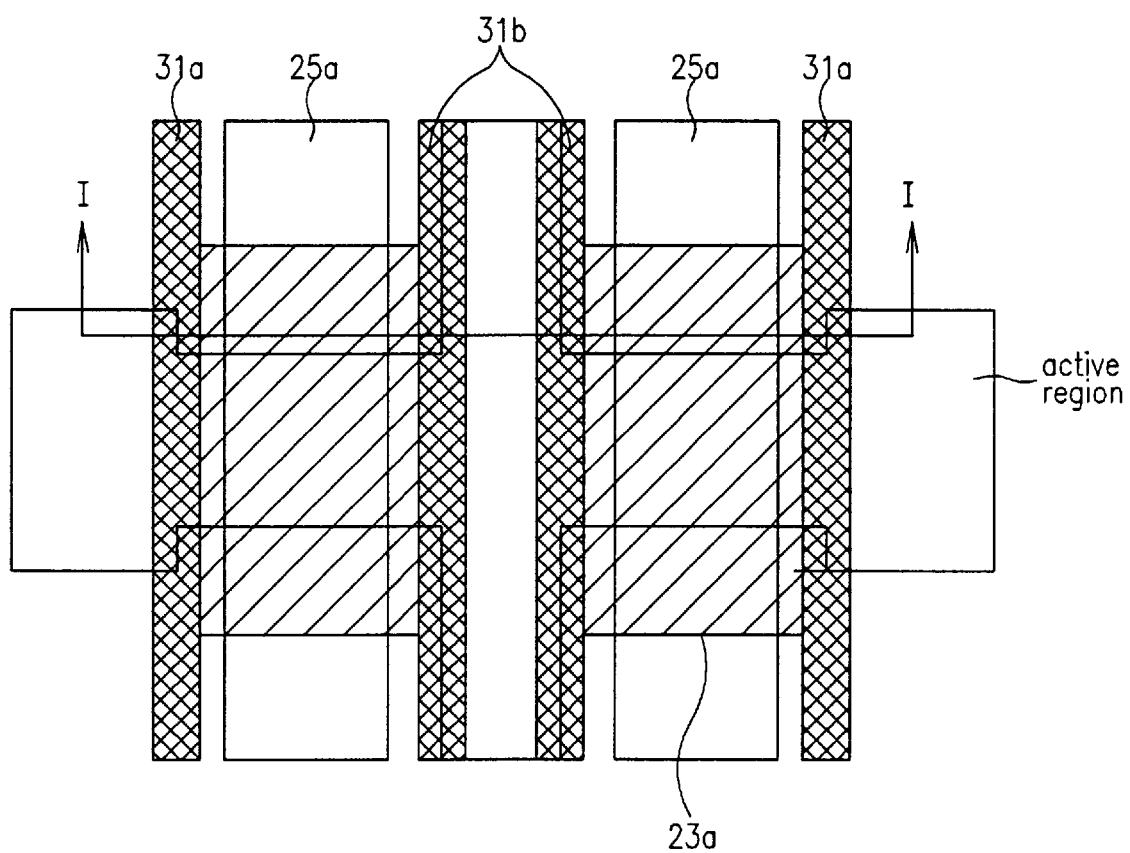
FIG. 3 is a diagram showing a plan view of a preferred embodiment of a semiconductor memory device according to the present invention.
Figure 4:
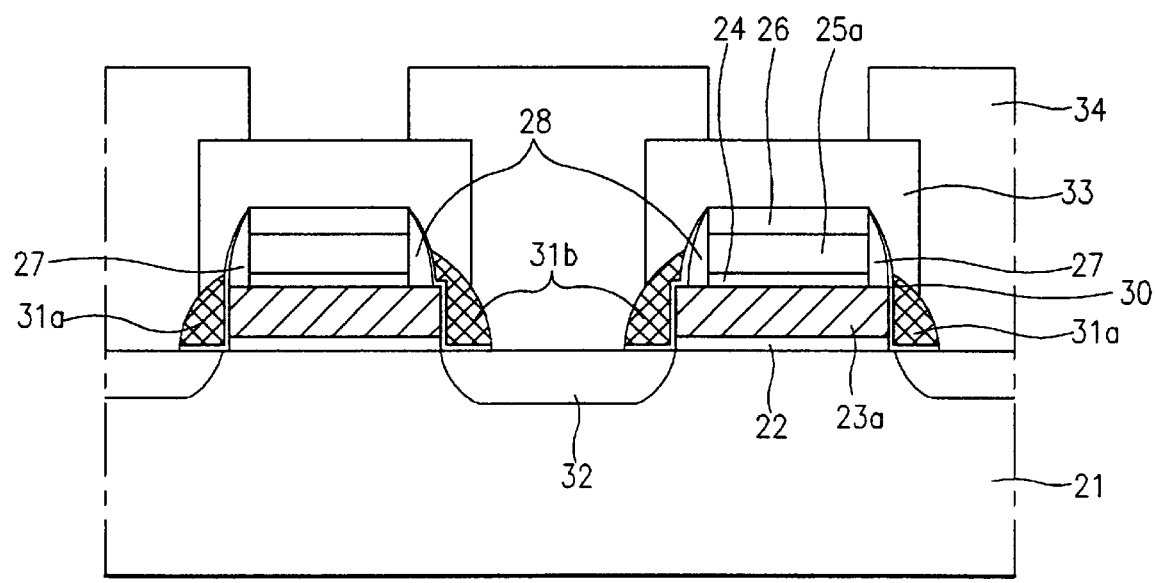
FIG. 4 is a diagram showing a cross-section along line IV—IV in FIG. 3.

As shown in FIGS. 3 and 4, a first preferred embodiment of a semiconductor memory device according to the present invention includes a gate oxide layer 22 and a floating gate 23a formed to be stacked on a predetermined region of a substrate 21. On the floating gate 23a, there are preferably sequentially formed a first interpoly dielectric layer 24, a control gate 25a, and a gate cap insulating layer 26, which are each individually thinner than the floating gate 23a. In this case, the three layers 24, 25a, and 26 are preferably not centered over the floating gate 23a, but biased or offset toward either of the sides of the floating gate 23a. In other words, a first distance between the control gate 25a and one side of the floating gate 23a is different from a second distance between the control gate 25a and the other side of the floating gate 23a.

Next, first and second insulating sidewalls 27 and 28 are preferably formed beside the first interpoly dielectric layer 24, the control gate 25a, and the gate cap insulating layer 26 and on side portions of the floating gate 23a. The first insulating sidewall 27 covers the exposed top of the floating gate 23a at the one side and the second insulating sidewall 28 covers the exposed top of the floating gate 23a at the other side of the floating gate 23a, excepting end portions of the floating gate 23a.

Subsequently, a second interpoly dielectric layer 30 is formed on both sides of the floating gate 23a and on adjacent portions of the substrate 21. Then, first and second polysilicon sidewalls 31a and 31b are formed on the second interpoly dielectric layer 30. The first polysilicon sidewall 31a is preferably shorter than the second polysilicon sidewall 31b. Impurity regions 32 are formed in the substrate 21 at the both sides of the floating gate 23a.

On the entire surface of the substrate 21 where the floating gate 23a and the control gate 25a are formed, an interlayer insulating layer 33 is formed to have contact holes each of which contacts with each of the impurity region 32 and the first and second polysilicon sidewalls 31a and 31b. A wire layer 34 is formed to contact with the impurity region 32 and the adjacent first and second polysilicon sidewalls 31a and 31b.

Figure 5A:
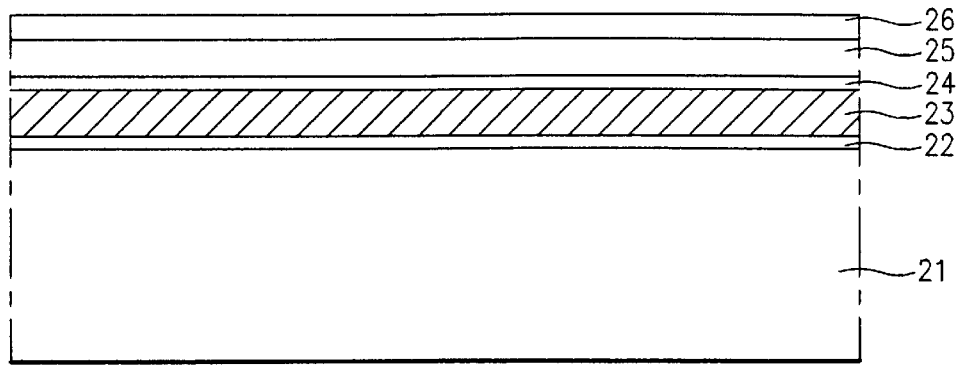
FIGS. 5a–5g are diagrams of cross-sections showing a preferred embodiment of a method for manufacturing a semiconductor memory device according to the present invention.

A second preferred embodiment according to the present invention being a method for manufacturing a semiconductor memory device will now be described with reference to the accompanying drawings. As shown in FIG. 5a, on a p-type substrate 21, a relatively-thick gate oxide layer 22 and then a first polysilicon layer 23 are preferably successively formed and then patterned. Next, there are successively preferably formed a first interpoly dielectric layer 24, a second polysilicon layer 25, and a gate cap insulating layer 26.

Figure 5B:
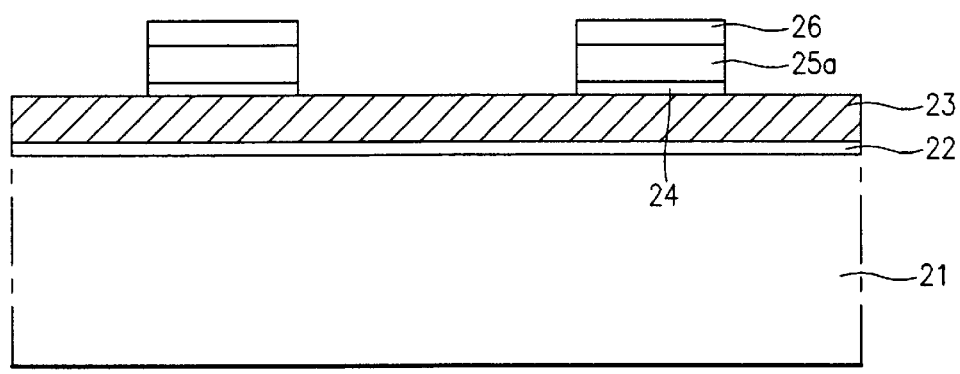

Referring then to FIG. 5b, the layers 26, 25, and 24 are patterned at substantially right angles to the gate oxide layer 22 and the first polysilicon layer 23, so that the first interpoly dielectric layer 24, the control gate 25a, and the gate cap insulating layer 26 are formed.

Figure 5C:
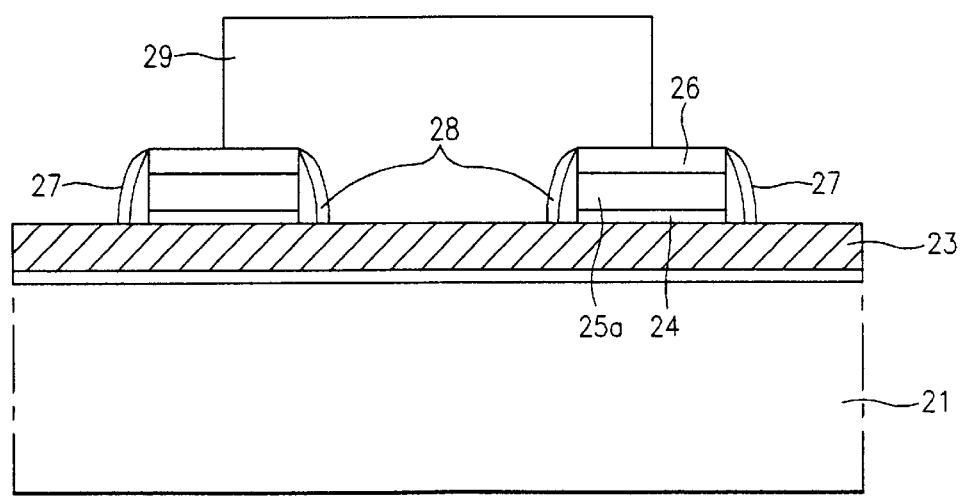

Referring to FIG. 5c, a high temperature low dielectric (HLD) layer is preferably formed and then is subjected to etch-back so that the HLD layer is left only on one side of each of the gate electrodes 25a. Further, the sides the HLD layer is formed on preferably face each other. Then, another HLD layer is formed on the entire surface and subjected to etch-back. Therefore, the double second insulating sidewalls 28 are formed on only one side of each of the control gates 25a. In this case, the sides of the control gates 25a face each other.

Thereafter, borophosphosilicate glass (BPSG) or a nitride layer is preferably formed and then subjected to etch-back to be left on only the other side of each of the control gates 25a. Then, BPSG or another nitride layer is preferably formed again and then subjected to etch-back to be left on only the other side, thereby forming first double insulating sidewalls 27.

Subsequently, a photoresist layer 29 is coated on the entire surface and then is patterned to be left only on the second double insulating sidewalls 28 on each of the control gates 25a and the substrate between the second double insulating sidewalls 28. Then, of the first double insulating sidewalls 27, the outer first insulating sidewall 27 is anisotropically etched, and the remaining photoresist layer 29 is removed.

Figure 5D:
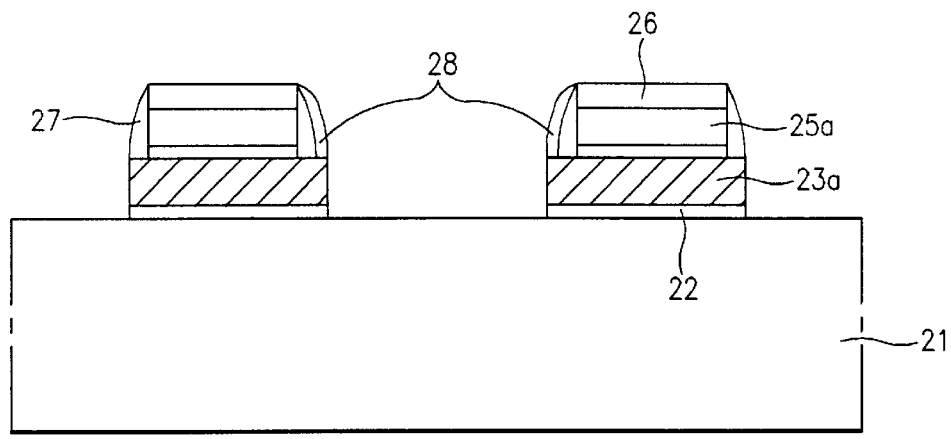

Referring to FIG. 5d, with the gate cap insulating layer 26, the first insulating sidewalls 27, and the second double insulating sidewalls 28 serving as masks, the first polysilicon layer 23 is patterned to form a floating gate 23a.

Figure 5E:
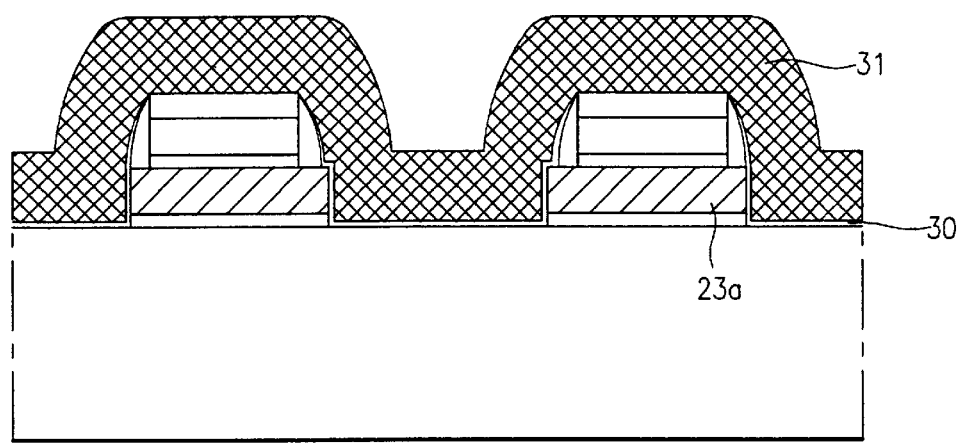

Referring to FIG. 5e, of the second double insulating sidewalls 28, the second outer insulating sidewall 28 is preferably anisotropically etched to expose the side portion and corner of the floating gate 23a. Next, on the entire surface, there is formed the thin second interpoly dielectric layer 30 preferably using a chemical vapor deposition (CVD) method. Then, a third polysilicon layer 31 is formed on the second interpoly dielectric layer 30.

Figure 5F:
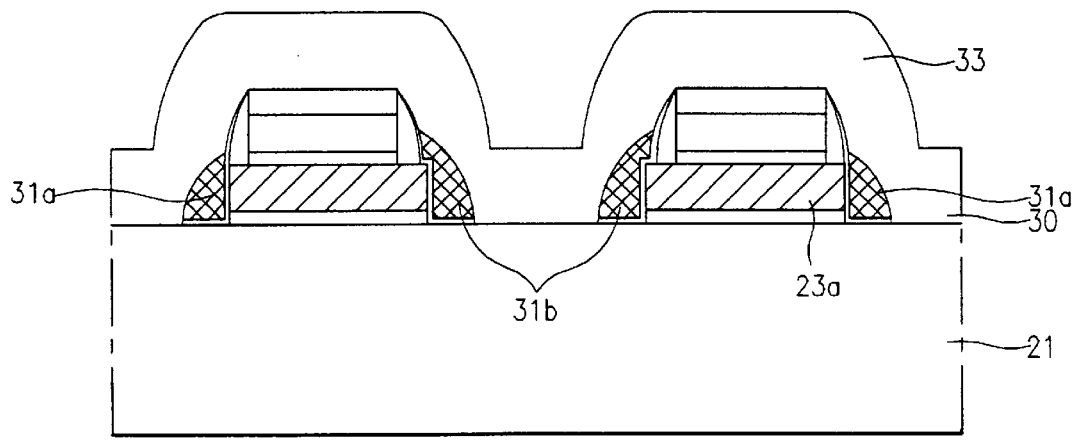

Referring to FIG. 5f, the third interpoly dielectric layer 31 is preferably anisotropically etched to form first and second polysilicon sidewalls 31a and 31b at both sides of each of the floating gates 23a. In this case, the second polysilicon sidewall 31b covers the corner of the floating gate 23a. The first polysilicon sidewall 31a has a smaller size than the second polysilicon sidewall 31b so that cells are preferably not coupled to each other. Subsequently, ions are implanted into the exposed substrate 21 and a thermal diffusion process is performed over the exposed substrate 21 to form an impurity region 32.

Figure 5G:
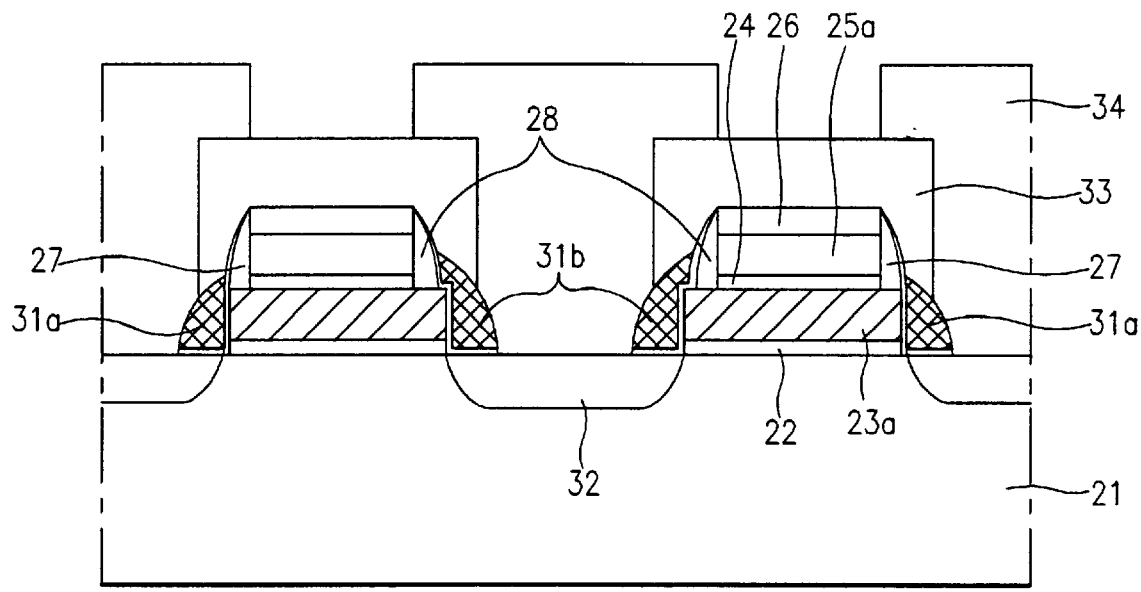

Referring to FIG. 5g, an interlayer insulating layer 33 is formed on the entire surface and then anisotropically etched to expose the first and second polysilicon sidewalls 31a and 31b and the impurity regions 32 to form contact holes. Next, on the contact hole and the interlayer insulating layer 33, there is formed a conductive material such as aluminum, tungsten, or polysilicon. Then, the conductive material is patterned to form a wire layer 34. In this case, the wire layer 34 preferably contacts with the first and second polysilicon sidewalls 31a and 31b, which completes the semiconductor memory device.

In the preferred embodiments, since a relatively thick gate oxide layer 22, not a thin tunnel oxide layer, is formed under the floating gate 23a, electrostatic capacity between the floating gate 23a and a channel is relatively decreased. Accordingly, a coupling ratio is increased.

Further, the first polysilicon sidewalls 31a, contacting with the impurity region 32 at one side of the floating gate 23a, applies a high electrostatic pressure to the impurity region 32 to inject channel high temperature electrons during a programming operation. The electrostatic pressure is induced by the electrostatic capacity between the first polysilicon sidewall 31a and the floating gate 23a. As a result, the coupling ratio is significantly increased on the programming operation.

During an erasing data operation, electrons flow out to the impurity region 32 through the second interpoly dielectric layer 30 beside the floating gate 23a, not through the floating gate 23a and the gate oxide layer 22. Electrons easily flow through the second interpoly dielectric layer 30 relative to the gate oxide layer 22 because of the characteristics of the interface of the oxide layer and the polysilicon. Thus, electrons travel through the floating gate 23a's corner where an electric field is concentrated, so that such an erasing operation is generated. The second polysilicon sidewall 31b acts as an erasing electrode on the erasing operation and as a connection line which connects sources.

Accordingly, the preferred embodiments of the semiconductor memory device and method of the present invention have various advantages. Since a thick gate oxide layer is used instead of a thin tunneling oxide layer and a coupling ratio is increased because of a first polysilicon sidewall, the efficiency of programming is heightened. Accordingly, a lower voltage can be applied to a control gate for programming operations.

Electron tunneling can be achieved from the floating gate to the second polysilicon sidewalls using a relatively low voltage in comparison with the electron tunneling from the floating gate to the impurity region. Thus, it is unnecessary to make a deep junction structure in order to prevent break-down in the impurity region. Moreover, since the second polysilicon sidewalls are preferably a drain junction, the process of forming the impurity region can be simplified. The impurity region can have a shallow structure and the effective channel length is lengthened so that a highly integrated cell can be produced, which achieves higher integration of a memory cell.

Because a voltage required for programming and erasing data is reduced, a low voltage memory cell can be produced. Since a tunneling oxide layer is not used, the process of forming a floating gate oxide layer is facilitated and the reliability of the floating gate oxide layer is improved. In addition, gate disturbance is reduced, that is to say, a cell is less programmed by gate applied voltage, which improves device reliability.

Since the erasing operation is achieved through the impurity region and the polysilicon sidewalls, there is reduced a voltage of the impurity region at one side of the floating gate, which increases a reading speed.

The foregoing embodiments are merely exemplary and are not to be construed as limiting the present invention. The present teaching can be readily applied to other types of apparatuses and methods. The description of the present invention is intended to be illustrative, and not to limit the scope of the claims. Many alternatives, modifications, and variations will be apparent to those skilled in the art.

What is claimed is:

1. A method for manufacturing a semiconductor device, the method comprising the steps of:

providing a substrate;

forming a gate oxide layer over the substrate and a floating gate over the gate oxide layer;

forming a first dielectric layer over the floating gate and a control gate over the first dielectric layer;

forming a second dielectric layer at first and second opposing sides of the floating gate and at a portion of a surface of the floating gate substantially perpendicular to the second side;

forming first and second conductive sidewalls on the second dielectric layer, said second conductive sidewall being formed on the second dielectric formed on the second side and the portion of the surface to overlap a corner of the floating gate; and forming impurity regions in the substrate at the first and second sides of the floating gate.

2. The method of claim 1, further comprising forming a wire layer in contact with the impurity regions and the conductive sidewalls, and wherein the impurity regions are formed at the first and second sides of the floating gate.

3. The method of claim 1, wherein the control gate is offset from a center line of the floating gate.

4. The method of claim 1, further comprising forming insulating sidewalls over the first and second sides of the control gate, wherein the second dielectric layer is formed on the insulating sidewalls.

5. The method of claim 4, wherein a portion of the insulating sidewall at the first side of the control gate is removed to form a first insulating sidewall on the first side of the control gate.

6. The method of claim 5, wherein said insulating sidewalls on the first and second sides of the control gate have different etch speed.

7. The method of claim 5, wherein prior to the formation of the second dielectric layer, a portion of the insulating sidewalls at the second side of the control gate is removed to expose a corner of the floating gate.

8. The method of claim 1, wherein the forming a gate oxide layer and a floating gate step comprises:

forming a first insulating layer and a semiconductor layer on the substrate and patterning the first insulating layer and the semiconductor layer;

forming insulating sidewalls on opposing sides of the second semiconductor layer;

forming and patterning a second insulating layer and a second semiconductor layer substantially perpendicular to the first insulating layer and the first semiconductor layer;

etching the first semiconductor layer and the first insulating layer with the insulating sidewalls and the second semiconductor layer serving as masks to form the gate oxide layer and the floating gate.

9. The method of claim 8, wherein the second insulating layer and the second semiconductor layer are respectively the first dielectric layer and the control gate.

* * * * *